United States Patent
Cihan et al.

(10) Patent No.: US 11,755,107 B1
(45) Date of Patent: Sep. 12, 2023

(54) FINGER DEVICES WITH PROXIMITY SENSORS

(71) Applicant: Apple Inc., Cupertino, CA (US)

(72) Inventors: Ahmet Fatih Cihan, San Jose, CA (US); Stephen E. Dey, San Francisco, CA (US); Adrian Z. Harb, San Jose, CA (US); Mengshu Huang, Cupertino, CA (US); Yuhao Pan, Sunnyvale, CA (US); Paul X. Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/021,945

(22) Filed: Sep. 15, 2020

Related U.S. Application Data

(60) Provisional application No. 62/904,540, filed on Sep. 23, 2019.

(51) Int. Cl.
G06F 3/01 (2006.01)
G06F 3/033 (2013.01)
H03K 17/96 (2006.01)

(52) U.S. Cl.
CPC ............. *G06F 3/014* (2013.01); *G06F 3/033* (2013.01); *H03K 17/9622* (2013.01); *G06F 2203/0331* (2013.01)

(58) Field of Classification Search
CPC ...... G06F 3/014; G06F 3/033; H03K 17/9622
See application file for complete search history.

(56) References Cited

U.S. PATENT DOCUMENTS

| 5,581,484 A | 12/1996 | Prince |
| 5,631,861 A * | 5/1997 | Kramer ................ G06F 3/016 703/7 |

(Continued)

FOREIGN PATENT DOCUMENTS

| CN | 104049739 A | 9/2014 |
| CN | 104281257 A | 1/2015 |

(Continued)

OTHER PUBLICATIONS

Hutson, Finger devices let users 'touch' virtual objects, Science, AAAS, Apr. 25, 2017, 4 pages.

(Continued)

*Primary Examiner* — Albert K Wong
(74) *Attorney, Agent, or Firm* — Treyz Law Group, P.C.; Kendall P. Woodruff

(57) ABSTRACT

A system may include one or more finger devices that gather input from a user's fingers. The system may include control circuitry that sends control signals to an electronic device based on the input gathered with the finger devices. A finger device may include one or more proximity sensors that measure a distance to the user's finger. The proximity sensor may be a self-mixing optical proximity sensor having a laser and photodiode. The proximity sensor may have submicron resolution and may be configured to detect very small movements of the finger as finger pad is moved around by a thumb finger, by a surface, and/or by other finger movements. The proximity sensor may measure changes in distance between the proximity sensor and a flexible membrane that rests against a side portion of the user's finger.

20 Claims, 11 Drawing Sheets

(56) References Cited

U.S. PATENT DOCUMENTS

| | | | |
|---|---|---|---|
| 5,764,164 A * | 6/1998 | Cartabiano | G06F 3/014 |
| | | | 400/100 |
| 6,236,037 B1 * | 5/2001 | Asada | G01L 5/22 |
| | | | 250/221 |
| 6,388,247 B2 * | 5/2002 | Asada | G06F 3/033 |
| | | | 250/221 |
| 8,368,641 B2 | 2/2013 | Tremblay et al. | |
| 8,610,548 B1 | 12/2013 | Provancher | |
| 8,724,861 B1 | 5/2014 | Sun | |
| 8,994,827 B2 | 3/2015 | Mistry et al. | |
| 9,104,271 B1 | 8/2015 | Adams et al. | |
| 9,110,505 B2 | 8/2015 | Mastandrea | |
| 9,711,060 B1 | 7/2017 | Lusted et al. | |
| 10,342,458 B2 * | 7/2019 | Ferreira | G01L 5/00 |
| 10,345,096 B2 * | 7/2019 | Allen | G01B 11/161 |
| 11,287,886 B1 * | 3/2022 | Harb | G06T 7/20 |
| 2003/0214481 A1 | 11/2003 | Xiong | |
| 2005/0052412 A1 | 3/2005 | McRae et al. | |
| 2006/0103634 A1 | 6/2006 | Kim et al. | |
| 2007/0030246 A1 | 2/2007 | Tremblay et al. | |
| 2007/0279380 A1 * | 12/2007 | Murillo | G06F 3/03549 |
| | | | 345/161 |
| 2009/0096746 A1 * | 4/2009 | Kruse | G06F 3/016 |
| | | | 340/407.1 |
| 2009/0153365 A1 | 6/2009 | Salsedo et al. | |
| 2009/0278798 A1 * | 11/2009 | Kim | G06F 3/017 |
| | | | 345/158 |
| 2009/0287898 A1 | 11/2009 | Kim et al. | |
| 2010/0103106 A1 | 4/2010 | Chui | |
| 2010/0231505 A1 | 9/2010 | Iwata | |
| 2011/0210931 A1 * | 9/2011 | Shai | G06F 3/03547 |
| | | | 345/173 |
| 2011/0213664 A1 | 9/2011 | Osterhout et al. | |
| 2013/0151960 A1 | 6/2013 | Wiertlewski et al. | |
| 2013/0162415 A1 | 6/2013 | Kim et al. | |
| 2014/0063060 A1 | 3/2014 | Maciocci et al. | |
| 2015/0248160 A2 | 9/2015 | Provancher et al. | |
| 2015/0277559 A1 | 10/2015 | Vescovi et al. | |
| 2016/0278665 A1 | 9/2016 | Ferreira et al. | |
| 2016/0287165 A1 | 10/2016 | Abreu | |
| 2016/0295989 A1 | 10/2016 | Hakeem et al. | |
| 2016/0313798 A1 | 10/2016 | Connor | |
| 2017/0003762 A1 | 1/2017 | Ishii et al. | |
| 2017/0045948 A1 | 2/2017 | Nattukallingal | |
| 2017/0090666 A1 | 3/2017 | Pahud et al. | |
| 2017/0143087 A1 | 5/2017 | Cunningham | |
| 2017/0188947 A1 | 7/2017 | Connor | |
| 2017/0192493 A1 | 7/2017 | Ofek et al. | |
| 2017/0212552 A1 | 7/2017 | Stotler | |
| 2017/0235332 A1 | 8/2017 | Von Badinski et al. | |
| 2017/0277367 A1 | 9/2017 | Pahud et al. | |
| 2017/0296363 A1 | 10/2017 | Yetkin et al. | |
| 2017/0330471 A1 | 11/2017 | Subiakto | |
| 2017/0357320 A1 | 12/2017 | Chaudhri et al. | |
| 2017/0367590 A1 | 12/2017 | Sebe et al. | |
| 2018/0286189 A1 | 10/2018 | Motamedi et al. | |
| 2018/0356907 A1 * | 12/2018 | Parazynski | A61B 34/74 |
| 2020/0026352 A1 * | 1/2020 | Wang | G06F 3/044 |
| 2021/0018981 A1 * | 1/2021 | Wang | H02J 7/32 |
| 2021/0034153 A1 * | 2/2021 | Van De Laar | G06F 3/0202 |
| 2021/0089131 A1 * | 3/2021 | Wang | G06F 3/014 |

FOREIGN PATENT DOCUMENTS

| | | |
|---|---|---|
| CN | 105739612 A | 7/2016 |
| CN | 105739676 A | 7/2016 |
| CN | 106155306 A | 11/2016 |
| JP | 2001104256 A | 4/2001 |
| JP | 2008171409 A | 7/2008 |
| JP | 2014142751 A | 8/2014 |
| JP | 2015521303 A | 7/2015 |
| JP | 2015219887 A | 12/2015 |
| JP | 2016033815 A | 3/2016 |
| JP | 2016118929 A | 6/2016 |
| KR | 1020140016122 A | 2/2014 |
| WO | 2012176610 A1 | 12/2012 |

OTHER PUBLICATIONS

Girard et al., HapTip: Displaying Haptic Shear Forces at the Fingertips for Multi-Finger Interaction in Virtual Environments, Frontiers in ICT, vol. 3, Article 6, Apr. 2016, 15 pages.

Aoki et al., Wearable Haptic Device to Present Contact Sensation Based on Cutaneous Sensation Using Thin Wire, Ace 2009, Oct. 29-Oct. 31, 2009, Athens, Greece.

Shilkrot et al., A Comprehensive Survey of Finger Augmentation Devices, ACM Computing Surveys, vol. 48, No. 2, Article 30, Publication date: Nov. 2015.

* cited by examiner

FINGER DEVICES WITH PROXIMITY SENSORS

This application claims the benefit of provisional patent application No. 62/904,540, filed Sep. 23, 2019, which is hereby incorporated by reference herein in its entirety.

FIELD

This relates generally to electronic devices, and, more particularly, to sensors for finger-mounted electronic devices.

BACKGROUND

Electronic devices such as computers can be controlled using computer mice and other input accessories. In virtual reality systems, force-feedback gloves can be used to control virtual objects. Cellular telephones may have touch screen displays and vibrators that are used to create haptic feedback in response to touch input.

Devices such as these may not be convenient for a user, may be cumbersome or uncomfortable, or may provide inadequate feedback.

SUMMARY

A system may include one or more finger devices that gather input from a user's fingers. The system may include control circuitry that sends control signals to an electronic device based on the input gathered with the finger devices.

A finger device may include one or more proximity sensors that measure a distance to the user's finger. The proximity sensor may be an optical proximity sensor such as a self-mixing interferometric optical proximity sensor having a laser and photodiode. The proximity sensor may have submicron resolution and may be configured to detect very small movements of the user's finger skin as the finger pad is moved around by a thumb finger, by a surface, and/or by other finger movements. The proximity sensor may measure changes in distance between the proximity sensor and a flexible membrane that rests against a side portion of the user's finger.

A self-mixing proximity sensor may have a coherent or partially coherent source of electromagnetic radiation. The source of radiation may, for example, be a coherent light source such as an infrared vertical cavity surface-emitting laser, a quantum cascade laser, or other laser. The self-mixing proximity sensor may also have a light detector such as a photodiode and/or other electromagnetic-radiation-sensitive element. The photodiode may be stacked with the laser and/or may be an intra-cavity photodiode that is located within the laser cavity.

The control circuitry can modulate the laser bias current signal to produce a target distance measurement corresponding to an absolute distance between the self-mixing proximity sensor and the user's finger (or a flexible membrane that rests against the user's finger). This modulation can enable the detection of the relative displacement of the user's finger (or a flexible membrane resting against the user's finger).

DETAILED DESCRIPTION

Figure 1:
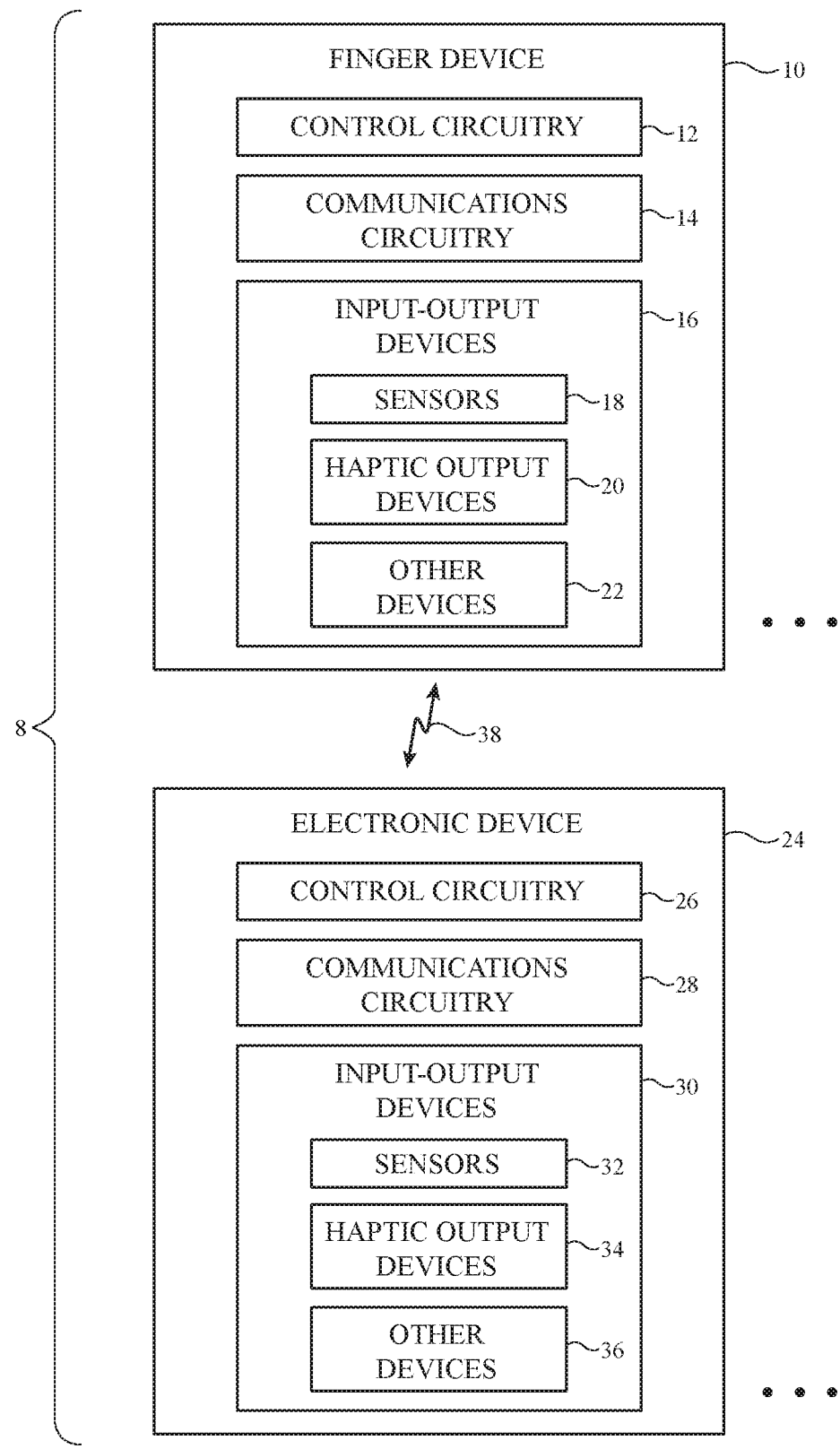
FIG. 1 is a schematic diagram of an illustrative system with a finger device in accordance with an embodiment.

Electronic devices that are configured to be mounted on the body of a user may be used to gather user input and to provide a user with output. For example, electronic devices that are configured to be worn on one or more of a user's fingers, which are sometimes referred to as finger devices or finger-mounted devices, may be used to gather user input and to supply output. A finger device may, as an example, include an inertial measurement unit with an accelerometer for gathering information on finger motions such as finger taps or free-space finger gestures, may include proximity sensors such as self-mixing interferometric optical proximity sensors for measuring small changes in distance to the finger surface as the finger moves, may include force sensors for gathering information on normal and shear forces in the finger device and the user's finger, and may include other sensors for gathering information on the interactions between the finger device (and the user's finger on which the device is mounted) and the surrounding environment. The finger device may include a haptic output device to provide the user's finger with haptic output and may include other output components.

One or more finger devices may gather user input from a user. The user may use finger devices in operating a virtual reality or mixed reality device (e.g., head-mounted equipment such as glasses, goggles, a helmet, or other device with a display) and/or in operating other equipment such as desktop computers, laptop computers, tablet computers, and other electronic devices. During operation, the finger devices may gather user input such as information on interactions between the finger device(s) and the surrounding environment (e.g., interactions between a user's fingers and the environment, including finger motions and other interactions associated with virtual content displayed for a user). The user input may be used in controlling visual output on the display. Corresponding haptic output may be provided to the user's fingers using the finger devices. Haptic output may be used, for example, to provide the fingers of a user with a desired texture sensation as a user is touching a real object or as a user is touching a virtual object. Haptic output can also be used to create detents and other haptic effects.

Finger devices can be worn on any or all of a user's fingers (e.g., the index finger, the index finger and thumb, three of a user's fingers on one of the user's hands, some or all fingers on both hands, etc.). To enhance the sensitivity of a user's touch as the user interacts with surrounding objects, finger devices may have inverted U shapes or other configurations that allow the finger devices to be worn over the top and sides of a user's finger tips while leaving the user's finger pads exposed. This allows a user to touch objects with the finger pad portions of the user's fingers during use. If desired, finger devices may be worn over knuckles on a user's finger, between knuckles, and/or on other portions of a user's finger. The use of finger devices on a user's finger tips is sometimes described herein as an example.

Users can use the finger devices to interact with any suitable electronic equipment. For example, a user may use one or more finger devices to interact with a virtual reality or mixed reality system (e.g., a head-mounted device with a display), to supply input to a desktop computer, tablet computer, cellular telephone, watch, ear buds, or other accessory, or to interact with other electronic equipment.

FIG. 1 is a schematic diagram of an illustrative system of the type that may include one or more finger devices. As shown in FIG. 1, system 8 may include electronic device(s) such as finger device(s) 10 and other electronic device(s) 24. Each finger device 10 may be worn on a finger of a user's hand. Additional electronic devices in system 8 such as devices 24 may include devices such as a laptop computer, a computer monitor containing an embedded computer, a tablet computer, a desktop computer (e.g., a display on a stand with an integrated computer processor and other computer circuitry), a cellular telephone, a media player, or other handheld or portable electronic device, a smaller device such as a wristwatch device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a remote control, a navigation device, an embedded system such as a system in which equipment is mounted in a kiosk, in an automobile, airplane, or other vehicle, a removable external case for electronic equipment, a strap, a wrist band or head band, a removable cover for a device, a case or bag that has straps or that has other structures to receive and carry electronic equipment and other items, a necklace or arm band, a wallet, sleeve, pocket, or other structure into which electronic equipment or other items may be inserted, part of a chair, sofa, or other seating (e.g., cushions or other seating structures), part of an item of clothing or other wearable item (e.g., a hat, belt, wrist band, headband, sock, glove, shirt, pants, etc.), or equipment that implements the functionality of two or more of these devices.

With one illustrative configuration, which may sometimes be described herein as an example, device 10 is a finger-mounted device having a finger-mounted housing with a U-shaped body that grasps a user's finger or a finger-mounted housing with other shapes configured to rest against a user's finger and device(s) 24 is a cellular telephone, tablet computer, laptop computer, wristwatch device, head-mounted device, a device with a speaker, or other electronic device (e.g., a device with a display, audio components, and/or other output components). A finger device with a U-shaped housing may have opposing left and right sides that are configured to receive a user's finger and a top housing portion that couples the left and right sides and that overlaps the user's fingernail.

Devices 10 and 24 may include control circuitry 12 and 26. Control circuitry 12 and 26 may include storage and processing circuitry for supporting the operation of system 8. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 12 and 26 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between devices 10 and 24 and/or to support communications between equipment in system 8 and external electronic equipment, control circuitry 12 may communicate using communications circuitry 14 and/or control circuitry 26 may communicate using communications circuitry 28. Circuitry 14 and/or 28 may include antennas, radio-frequency transceiver circuitry, and other wireless communications circuitry and/or wired communications circuitry. Circuitry 14 and/or 26, which may sometimes be referred to as control circuitry and/or control and communications circuitry, may, for example, support bidirectional wireless communications between devices 10 and 24 over wireless link 38 (e.g., a wireless local area network link, a near-field communications link, or other suitable wired or wireless communications link (e.g., a Bluetooth® link, a WiFi® link, a 60 GHz link or other millimeter wave link, etc.). Devices 10 and 24 may also include power circuits for transmitting and/or receiving wired and/or wireless power and may include batteries. In configurations in which wireless power transfer is supported between devices 10 and 24, in-band wireless communications may be supported using inductive power transfer coils (as an example).

Devices 10 and 24 may include input-output devices such as devices 16 and 30. Input-output devices 16 and/or 30 may be used in gathering user input, in gathering information on the environment surrounding the user, and/or in providing a user with output. Devices 16 may include sensors 18 and devices 24 may include sensors 32. Sensors 18 and/or 32 may include proximity sensors (e.g., self-mixing optical proximity sensors), force sensors (e.g., strain gauges, capacitive force sensors, resistive force sensors, etc.), audio sensors such as microphones, touch and/or proximity sensors such as capacitive sensors, optical sensors such as optical sensors that emit and detect light, ultrasonic sensors (e.g., ultrasonic sensors for tracking device orientation and location and/or for detecting user input such as finger input), and/or other touch sensors and/or proximity sensors, monochromatic and color ambient light sensors, image sensors, sensors for detecting position, orientation, and/or motion (e.g., accelerometers, magnetic sensors such as compass sensors, gyroscopes, and/or inertial measurement units that contain some or all of these sensors), muscle activity sensors (EMG) for detecting finger actions, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, optical sensors such as visual odometry sensors that gather position and/or orientation information using images gathered with digital image sensors in cameras, gaze tracking sensors, visible light and/or infrared cameras having digital image sensors, humidity sensors, moisture sensors, and/or other sensors. In some arrangements, devices 10 and/or 24 may use sensors 18 and/or 32 and/or other input-output devices 16 and/or 30 to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.). If desired, device 10 and/or device 24 may include rotating buttons (e.g., a crown mechanism on a watch or finger device or other suitable rotary button that rotates and that optionally can be depressed to select items of interest). Alphanumeric keys and/or other buttons may be included in devices 16 and/or 30. In some configurations, sensors 18 may include joysticks, roller balls, optical sensors (e.g., lasers that emit light and image sensors that track motion by monitoring and analyzing changings in the speckle patterns and other information associated with surfaces illuminated with the emitted light as device 10 is moved relative to those surfaces), fingerprint sensors, and/or other sensing circuitry. Radio-frequency tracking devices may be included in sensors 18 to detect location, orientation, and/or range. Beacons (e.g., radio-frequency beacons) may be used to emit radio-frequency signals at different locations in a user's environment (e.g., at one or more registered locations in a user's home or office). Radio-frequency beacon signals can be analyzed by devices 10 and/or 24 to help determine the location and position of devices 10 and/or 24 relative to the beacons. If desired, devices 10 and/or 24 may include beacons. Frequency strength (received signal strength information), beacon orientation, time-of-flight information, and/or other radio-frequency information may be used in determining orientation and position information. At some frequencies (e.g., lower frequencies such as frequencies below 10 GHz), signal strength information may be used, whereas at other frequencies (e.g., higher frequencies such as frequencies above 10 GHz), indoor radar schemes may be used). If desired, light-based beacons, ultrasonic beacons, and/or other beacon devices may be used in system 8 in addition to or instead of using radio-frequency beacons and/or radio-frequency radar technology.

Devices 16 and/or 30 may include haptic output devices 20 and/or 34. Haptic output devices 20 and/or 34 can produce motion that is sensed by the user (e.g., through the user's fingertips). Haptic output devices 20 and/or 34 may include actuators such as electromagnetic actuators, motors, piezoelectric actuators, electroactive polymer actuators, vibrators, linear actuators (e.g., linear resonant actuators), rotational actuators, actuators that bend bendable members, actuator devices that create and/or control repulsive and/or attractive forces between devices 10 and/or 24 (e.g., components for creating electrostatic repulsion and/or attraction such as electrodes, components for producing ultrasonic output such as ultrasonic transducers, components for producing magnetic interactions such as electromagnets for producing direct-current and/or alternating-current magnetic fields, permanent magnets, magnetic materials such as iron or ferrite, and/or other circuitry for producing repulsive and/or attractive forces between devices 10 and/or 24). In some situations, actuators for creating forces in device 10 may be used in squeezing a user's finger and/or otherwise directly interacting with a user's finger pulp. In other situations, these components may be used to interact with each other (e.g., by creating a dynamically adjustable electromagnetic repulsion and/or attraction force between a pair of devices 10 and/or between device(s) 10 and device(s) 24 using electromagnets).

If desired, input-output devices 16 and/or 30 may include other devices 22 and/or 36 such as displays (e.g., in device 24 to display images for a user), status indicator lights (e.g., a light-emitting diode in device 10 and/or 24 that serves as a power indicator, and other light-based output devices), speakers and other audio output devices, electromagnets, permanent magnets, structures formed from magnetic material (e.g., iron bars or other ferromagnetic members that are attracted to magnets such as electromagnets and/or permanent magnets), batteries, etc. Devices 10 and/or 24 may also include power transmitting and/or receiving circuits configured to transmit and/or receive wired and/or wireless power signals.

Figure 2:
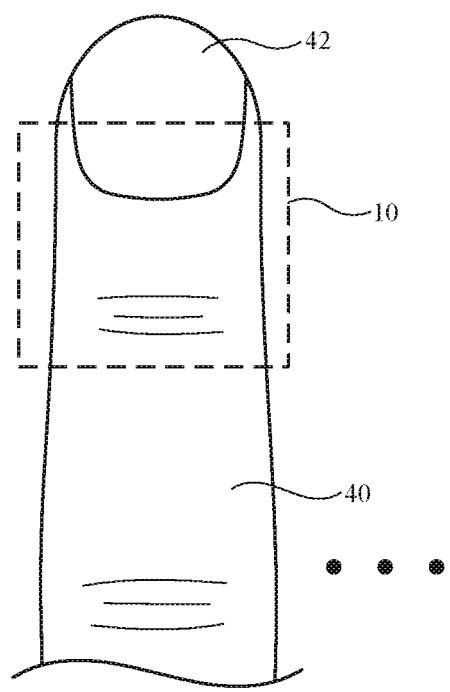
FIG. 2 is a top view of an illustrative finger of a user on which a finger device has been placed in accordance with an embodiment.

FIG. 2 is a top view of a user's finger (finger 40) and an illustrative finger-mounted device 10. As shown in FIG. 2, device 10 may be formed from a finger-mounted unit that is mounted on or near the tip of finger 40 (e.g., partly or completely overlapping fingernail 42). If desired, device 10 may be worn elsewhere on a user's fingers such as over a knuckle, between knuckles, etc. Configurations in which a device such as device 10 is worn between fingers 40 may also be used.

A user may wear one or more of devices 10 simultaneously. For example, a user may wear a single one of devices 10 on the user's ring finger or index finger. As another example, a user may wear a first device 10 on the user's thumb, a second device 10 on the user's index finger, and an optional third device 10 on the user's middle finger. Arrangements in which devices 10 are worn on other fingers and/or all fingers of one or both hands of a user may also be used.

Control circuitry 12 (and, if desired, communications circuitry 14 and/or input-output devices 16) may be contained entirely within device 10 (e.g., in a housing for a fingertip-mounted unit) and/or may include circuitry that is coupled to a fingertip structure (e.g., by wires from an associated wrist band, glove, fingerless glove, etc.). Configurations in which devices 10 have bodies that are mounted on individual user fingertips are sometimes described herein as an example.

Figure 3:
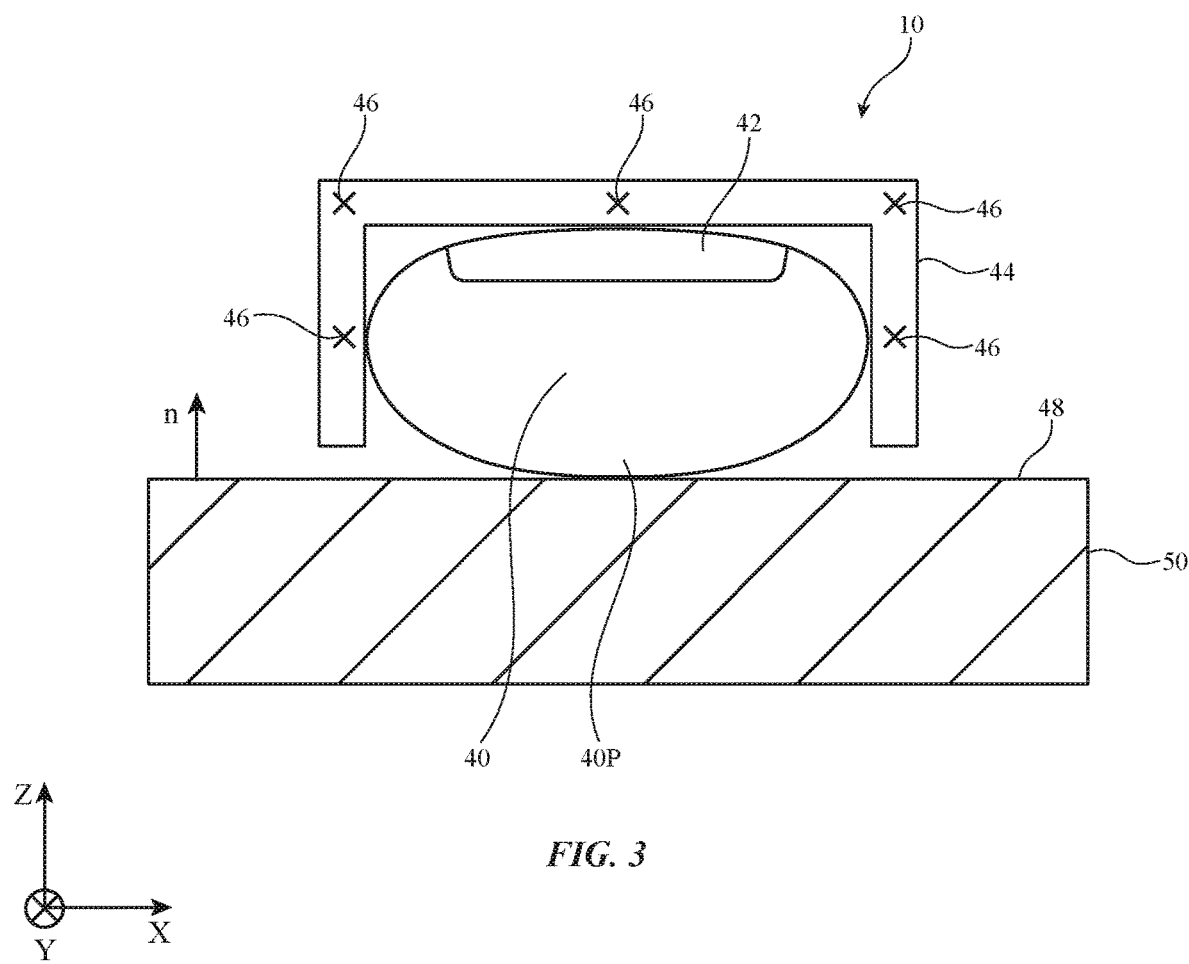
FIG. 3 is a cross-sectional side view of an illustrative finger device on the finger of a user in accordance with an embodiment.

FIG. 3 is a cross-sectional side view of an illustrative finger device (finger-mounted device) 10 showing illustrative mounting locations 46 for electrical components (e.g., control circuitry 12, communications circuitry 14, and/or input-output devices 16 such as sensors 18, haptic output devices 20, and/or other devices 22) within and/or on the surface(s) of finger device housing 44. These components may, if desired, be incorporated into other portions of housing 44.

As shown in FIG. 3, housing 44 may have a U shape (e.g., housing 44 may be a U-shaped housing structure that faces downwardly and covers the upper surface of the tip of user finger 40 and fingernail 42). During operation, a user may press against structures such as structure 50. As the bottom of finger 40 (e.g., finger pulp 40P) presses against surface 48 of structure 50, the user's finger may compress and force portions of the finger outwardly against the sidewall portions of housing 44 (e.g., for sensing by force sensors or other sensors mounted to the side portions of housing 44). Lateral movement of finger 40 in the X-Y plane may also be sensed using force sensors or other sensors on the sidewalls of housing 44 or other portions of housing 44 (e.g., because lateral movement will tend to press portions of finger 40 against some sensors more than others and/or will create shear forces that are measured by force sensors that are configured to sense shear forces).

Ultrasonic sensors, optical sensors, inertial measurement units, strain gauges and other force sensors, radio-frequency sensors, and/or other sensors may be used in gathering sensor measurements indicative of the activities of finger 40. If desired, these sensors may also be used in mapping the contours of three-dimensional objects (e.g., by time-of-flight measurements and/or other measurements). For example, an ultrasonic sensor such as a two-dimensional image sensor or an ultrasonic sensor with a single ultrasonic transducer element may emit free-space ultrasonic sound signals that are received and processed after reflecting off of external objects. This allows a three-dimensional ultrasonic map to be generated indicating the shapes and locations of the external objects.

In some configurations, finger activity information (position, movement, orientation, etc.) may be gathered using sensors that are mounted in external electronic equipment (e.g., in a computer or other desktop device, in a head-mounted device or other wearable device, and/or in other electronic device 24 that is separate from device 10). For example, optical sensors such as images sensors that are separate from devices 10 may be used in monitoring devices 10 to determine their position, movement, and/or orientation. If desired, devices 10 may include passive and/or active optical registration features to assist an image sensor in device 24 in tracking the position, orientation, and/or motion of device 10. For example, devices 10 may include light-emitting devices such as light-emitting diodes and/or lasers. The light-emitting devices may include light-emitting diodes, lasers (e.g., laser diodes, vertical cavity surface-emitting lasers, etc.), or other light sources and may operate at visible wavelengths, ultraviolet wavelengths, and/or infrared wavelengths. The light-emitting devices may be arranged in an asymmetric pattern on housing 44 and may emit light that is detected by an image sensor, depth sensor, and/or other light-based tracking sensor circuitry in device 24 (e.g., a head-mounted device, desktop computer, stand-alone camera-based monitoring systems, and/or other electrical equipment with an image sensor or other tracking sensor circuitry). By processing the received patterned of emitted light, device 24 can determine the position, orientation, and/or motion of device 10. If desired, the light-emitting devices can be removable and/or customizable (e.g., a user can customize the location and type of light-emitting devices).

Tracking can also be performed that involves extrapolating from a known body part orientation (e.g., a finger orientation) to produce orientation information on other body parts (e.g., wrist and/or arm orientation estimated using inverse kinematics). Visual odometry sensors may, if desired, be included in devices 10. These sensors may include image sensors that gather frames of image data of the surroundings of devices 10 and may be used in measuring position, orientation, and/or motion from the frame of image data. Lidar, ultrasonic sensors oriented in multiple directions, radio-frequency tracking sensors, and/or other finger device tracking arrangements may be used, if desired. In some arrangements, user input for controlling system 8 can include both user finger input and other user input (e.g., user eye gaze input, user voice input, etc.). For example, gaze tracking information such as a user's point-of-gaze measured with a gaze tracker can be fused with finger input when controlling device 10 and/or devices 24 in system 8. A user may, for example, gaze at an object of interest while device 10 using one or more of sensors 18 (e.g., an accelerometer, force sensor, touch sensor, etc.) to gather information such as tap input (movement of device 10 resulting in measurable forces and/or accelerometer output when device 10 strikes a table top or other external surface), double-tap input, force input, multi-finger gestures (taps, swipes, and/or other gestures on external surfaces and/or the housing surfaces of multiple devices 10), drag and drop operations associated with objects selected using a lingering gaze or other point-of-gaze input, etc. The finger input may include information on finger orientation, position, and/or motion and may include information on how forcefully a finger is pressing against surfaces (e.g., force information). Finger pointing input (e.g., the direction of finger pointing)

may be gathered using radio-frequency sensors among sensors 18 and/or other sensors in device(s) 10.

If desired, user input may include air gestures (sometimes referred to as three-dimensional gestures or non-contact gestures) gathered with sensors 18 (e.g., proximity sensors, image sensors, ultrasonic sensors, radio-frequency sensors, etc.). Air gestures (e.g., non-contact gestures in which a user's fingers hover and/or move relative to the sensors 18 of device 10 and/or in which device 10 hovers and/or moves relative to external surfaces) and/or touch and/or force-based input may include multifinger gestures (e.g., pinch to zoom, etc.). In some embodiments, a user may wear multiple devices 10 (e.g., on a thumb and index finger) and these devices may be used to gather finger pinch input such as pinch click gesture input or pinch force input. For example, a pinch click input may be detected when a tap (e.g., a peak in an accelerometer output signal) for a thumb device correlates with a tap for an index finger device and/or pinch force input may be gathered by measuring strain gauge output with strain gauges in devices 10 as the devices 10 press against each other. Pinch force can also be detected by measuring the size of the contact patch produced when a finger presses against a two-dimensional touch sensor (larger contact area being associated with larger applied force). As another example, pinch input and/or other finger gestures that involve contact with the finger pad may be detected using a proximity sensor that measures small changes in distance to the finger as the finger pad is moved (e.g., as the finger pad of a pointer finger is moved around by a thumb finger and/or moved around by a surface as the finger pad makes contact with the surface).

By correlating user input from a first of devices 10 with user input from a second of devices 10 and/or by otherwise analyzing finger device sensor input, pinch gestures (e.g., pinch click or pinch tap gestures and/or pinch force input) and other multi-device input may be detected and used in manipulating virtual objects or taking other actions in system 8. Consider, as an example, the use of a pinch gesture to select a virtual object associated with a user's current point-of-gaze. Once the virtual object has been selected based on the direction of the user's point-of-gaze (or finger point direction input) and based on the pinch gesture input or other user input, further user input gathered with one or more devices 10 may be used to rotate and/or otherwise manipulate the virtual object. For example, information on finger movement (e.g., rotational movement) may be gathered using an internal measurement unit or other sensor 18 in device(s) 10 and this rotational input used to rotate the selected object. In some scenarios, an object may be selected based on point-of-gaze (e.g., when a user's point-of-gaze is detected as being directed toward the object) and, following selection, object attributes (e.g., virtual object attributes such as virtual object appearance and/or real-world object attributes such as the operating settings of a real-world device) can be adjusted using strain gauge or touch sensor contact patch pinch input (e.g., detected pinch force between finger devices 10 that are being pinched together on opposing fingers) and/or can be adjusted using finger device orientation input (e.g., to rotate a virtual object, etc.).

If desired, gestures such as air gestures (three-dimensional gestures) may involve additional input. For example, a user may control system 8 using hybrid gestures that involve movement of device(s) 10 through the air (e.g., an air gesture component) and that also involve contact (and, if desired, movement) of a thumb or other finger against a two-dimensional touch sensor, force sensor, or other sensor 18. As an example, an inertial measurement unit may detect user movement of finger 40 through the air (e.g., to trace out a path) while detecting force input, touch input, or other input (e.g., finger pinch input or other input to adjust a line or other virtual object that is being drawn along the path).

The sensors in device 10 may, for example, measure how forcefully a user is moving device 10 (and finger 40) against surface 48 (e.g., in a direction parallel to the surface normal n of surface 48 such as the −Z direction of FIG. 3) and/or how forcefully a user is moving device 10 (and finger 40) within the X-Y plane, tangential to surface 48. The direction of movement of device 10 in the X-Y plane and/or in the Z direction can also be measured by the force sensors and/or other sensors 18 at locations 46.

Structure 50 may be a portion of a housing of device 24, may be a portion of another device 10 (e.g., another housing 44), may be a portion of a user's finger 40 or other body part, may be a surface of a real-world object such as a table, a movable real-world object such as a bottle or pen, or other inanimate object external to device 10, and/or may be any other structure that the user can contact with finger 40 while moving finger 40 in a desired direction with a desired force. Because motions such as these can be sensed by device 10, device(s) 10 can be used to gather pointing input (e.g., input moving a cursor or other virtual object on a display such as a display in devices 36), can be used to gather tap input, swipe input, pinch-to-zoom input (e.g., when a pair of devices 10 is used), or other gesture input (e.g., finger gestures, hand gestures, arm motions, etc.), and/or can be used to gather other user input.

Figure 4:
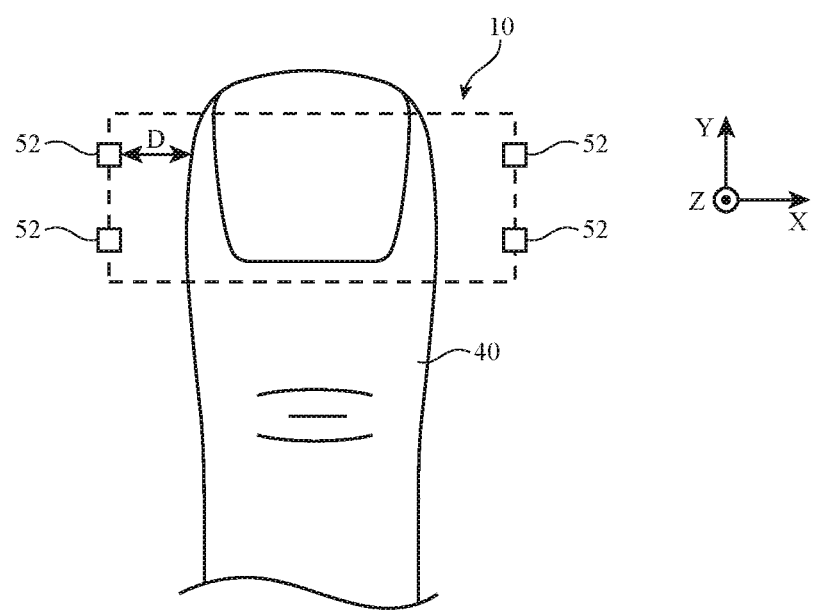
FIG. 4 is a top view of an illustrative finger device with displacement sensors in accordance with an embodiment.

FIG. 4 is a top view of an illustrative finger device on a finger of a user. In the illustrative configuration of FIG. 4, device 10 includes one or more proximity sensors such as proximity sensors 52. Proximity sensors 52 (sometimes referred to as distance sensors or displacement sensors) may each be configured to measure a distance D between finger 40 and proximity sensor 52. The distances between finger 40 and sensors 52 may change as the user moves finger 40 in the air, touches finger 40 on a surface, and/or touches finger 40 with another finger. Based on the distance changes recorded by each sensor 52, control circuitry 12 may determine how finger 40 is moving and may take corresponding action. For example, control circuitry 12 may send control signals to one or more electronic devices (e.g., device 24 of FIG. 1) in response to the finger movements measured by sensors 52.

Proximity sensors in device 10 such as sensors 52 may be optical sensors (e.g., having a light source and a light detector), ultrasonic sensors (e.g., having a ultrasonic transducer and a corresponding detector), magnetic sensors, capacitive sensors, pressure sensors, and/or other sensors configured to gather information on the distance D between finger 40 and sensors 52. Arrangements in which sensors 52 are based on piezoelectric materials or based on mechanical switches may also be used, if desired.

In one illustrative arrangement, which may sometimes be described herein as an example, proximity sensors 52 (sometimes referred to as distance sensors or displacement sensors) may include self-mixing interferometric proximity sensors (sometimes referred to as self-mixing optical proximity sensors, self-mixing proximity sensors, self-mixing interferometers, etc.). A self-mixing proximity sensor may have a coherent or partially coherent source of electromagnetic radiation. The source of radiation may, for example, be a coherent light source such as an infrared vertical cavity surface-emitting laser, a quantum cascade laser, or other laser. The self-mixing proximity sensor may also have a light detector such as a photodiode and/or other electromagnetic-radiation-sensitive element.

Self-mixing proximity sensors may have submicron resolution and may be configured to detect very small changes in distance. This allows sensors 52 to detect very small movements of finger 40 (sometimes referred to as microgestures or nanogestures). If desired, the optical axis of each sensor 52 may be angled towards a center region of the finger pad to increase sensor sensitivity to finger displacements that result from the finger pad contacting an external surface or another finger.

FIGS. 5, 6, 7, 8, 9, 10, 11, 12, 13, and 14 show illustrative examples of user input that may be detected with proximity sensors 52 in device 10 such as self-mixing optical proximity sensors.

Figure 5:
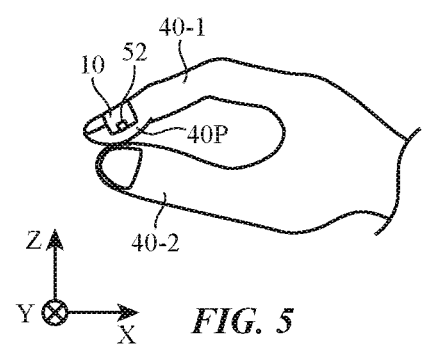
FIG. 5 is a perspective view of an illustrative finger device measuring movement of a finger as the user contacts the finger with another finger in accordance with an embodiment.

In the example of FIG. 5, finger device 10 is being used to detect finger input to the finger pulp. In particular, one or more proximity sensors 52 in device 10 may measure changes in distance between sensors 52 and finger 40-1 (e.g., a pointer finger or other suitable finger wearing device 10) as finger 40-2 (e.g., a thumb or other suitable finger) makes contact with finger pulp 40P of finger 40-1. Sensors 52 may detect lateral movement of finger pulp 40 in which pulp 40P moves relative to finger 40-2 and may also detect movement of finger pulp 40P with little or no actual movement of pulp 40P relative to finger 40-2. For example, the user may use finger 40-2 to move finger pulp 40P around (e.g., from side-to-side, from front-to back, from back-to-front, or any other suitable direction) without actually sliding finger 40-2 across finger pulp 40P. Because this movement of finger pulp 40P somewhat resembles the movement of a joystick, this type of input may sometimes be referred to as joystick input. Sensors 52 may also detect taps and pinches between fingers 40-1 and 40-2, since such movements will push the sides of finger 40-1 outward towards sensors 52 and will therefore result in corresponding changes in distance between the sides of finger 40-1 and sensors 52.

Figure 6:
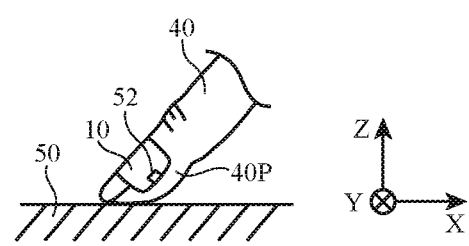
FIG. 6 is a perspective view of an illustrative finger device measuring movement of a finger as the finger contacts a surface in accordance with an embodiment.

FIG. 6 shows an example in which finger device 10 is being used to detect finger input on a surface of structure 50. In particular, one or more proximity sensors 52 in device 10 may measure changes in distance between sensors 52 and finger 40 (e.g., a pointer finger or other suitable finger wearing device 10) as finger 40 makes contact with structure 50. Sensors 52 may detect lateral movement of finger pulp 40P in which pulp 40P moves relative to structure 50 and may also detect movement of finger pulp 40P with little or no actual movement of pulp 40P relative to structure 50. For example, the user may move finger pulp 40P around on structure 50 (e.g., from side-to-side, from front-to back, from back-to-front, or any other suitable direction) without actually sliding finger 40 across structure 50. Because this movement of finger pulp 40P somewhat resembles the movement of a joystick, this type of input may sometimes be referred to as joystick input. Sensors 52 may also detect taps and presses of finger 40 on structure 50, since such movements will push the sides of finger 40-1 outward towards sensors 52 and will therefore result in corresponding changes in distance between the sides of finger 40-1 and sensors 52.

Figure 7:
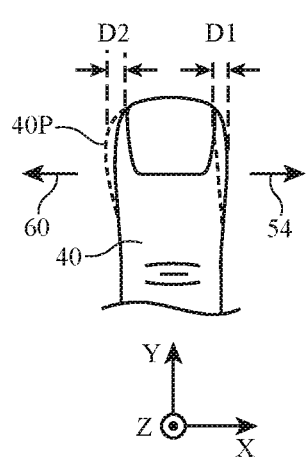
FIGS. 7, 8, and 9 are top views of a finger making illustrative finger movements that may be detected with a finger device in accordance with embodiments.
Figure 8:
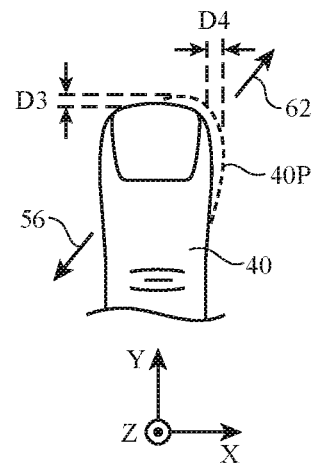
Figure 9:
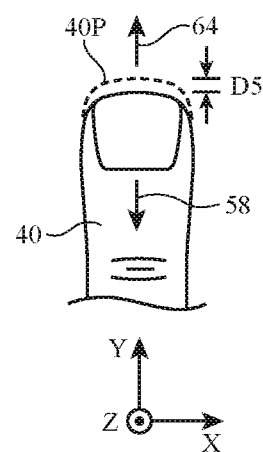

FIGS. 7, 8, and 9 show illustrative movements of finger pulp 40P that may be detected using distance sensors such as proximity sensors 52. For simplicity, device 10 is not shown in these figures, but it should be understood that device 10 may be mounted on top of finger 40 and may have one or more proximity sensors such as sensors 52 that measure distance changes between finger 40 and sensors 52 as finger pulp 40P moves around (e.g., as finger pulp 40P is moved around by another finger such as a user's thumb as shown in FIG. 5 and/or as finger pulp 40P is moved around by a surface as shown in FIG. 6).

In the example of FIG. 7, finger pulp 40P of finger 40 is being moved to the left in direction 60. This movement may be a result of the user moving finger 40 (and/or applying shear force) on a surface to the right in direction 54, or this may be a result of a user pushing finger pulp 40P to the left in direction 60 with another finger (e.g., a thumb finger or other suitable finger). The movement of finger pulp 40P in direction 60 results in distance change D1 on the right side of finger 40 and distance change D2 on the left side of finger 40. D1 represents the distance traveled by the right side portion of finger 40 as finger 40 moves in direction 60, and D2 represents the distance traveled by the left side portion of finger 40 as finger 40 moves in direction 60.

In the example of FIG. 8, finger pulp 40P of finger 40 is being moved diagonally in direction 62. This movement may be a result of the user moving finger 40 (and/or applying shear force) on a surface in direction 56, or this may be a result of a user pushing finger pulp 40P in direction 62 with another finger (e.g., a thumb finger or other suitable finger). The movement of finger pulp 40P in direction 62 results in distance change D3 on the end of finger 40 and distance change D4 on the right side of finger 40. D3 represents the distance traveled by the end (e.g., the tip) of finger 40 as finger 40 moves in direction 62, and D4 represents the distance traveled by the right side of finger 40 as finger 40 moves in direction 62.

In the example of FIG. 9, finger pulp 40P of finger 40 is being moved forward in direction 64. This movement may be a result of the user moving finger 40 (and/or applying shear force) on a surface in direction 58, or this may be a result of a user pushing finger pulp 40P in direction 64 with another finger (e.g., a thumb finger or other suitable finger). The movement of finger pulp 40P in direction 64 results in distance change D5 on the end of finger 40. D5 represents the distance traveled by the end (e.g., the tip) of finger 40 as finger 40 moves in direction 64.

The examples of FIGS. 7, 8, and 9 are merely illustrative examples of the types of finger movements that may be detected using one or more proximity sensors 52 in device 10. Proximity sensors 52 may be configured to detect taps, presses, pinches, and/or other suitable finger gestures by measuring the small changes in distance between finger 40 and sensor(s) 52 that result from such finger gestures. Sensors 52 may include any suitable number of sensors at any suitable location on device 10 (e.g., one or more sensors 52 may be located on the right side of finger 40, may be located on the left side of finger 40, may be located on the tip of finger 40, may be located on top of the fingernail of finger 40, and/or may be located in other positions relative to finger 40). If desired, displacement data from multiple sensors 52 may be compared to determine precisely the amount and direction with which finger 40 (e.g., finger pulp 40P) moves in response to finger gestures made with the finger wearing device 10.

In addition to detecting movement of finger pulp 40P, sensors 52 may be used to detect other finger gestures that result in changes in distance between finger 40 and sensors 52. FIGS. 10, 11, 12, 13, and 14 are illustrative examples of other types of finger gestures that may be detected using proximity sensors 52 (e.g., optical proximity sensors such as self-mixing optical proximity sensors and/or other proximity sensors that can measure changes in the position of finger 40).

Figure 10:
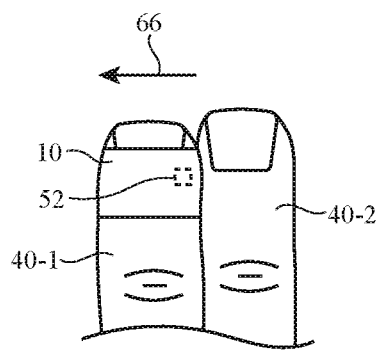
FIG. 10 is a top view of an illustrative finger device being used to detect an adjacent finger in accordance with an embodiment.

FIG. 10 is an example in which device 10 is being used to detect the proximity of one or more adjacent fingers. In particular, device 10 may be worn on finger 40-1 (e.g., a pointer finger or other suitable finger) and may detect activities of finger 40-2 (e.g., a middle finger or other suitable finger) as it makes contact with and/or as it comes in proximity to device 10. For example, sensor 52 may detect a decrease in distance between sensor 52 and finger 40-1 as finger 40-2 makes contact with finger 40-1 (and/or makes contact with device 10 on finger 40-1). Detecting when finger 40-2 is in contact with or close proximity to finger 40-1 may be used to provide a different type of input than that associated with a single finger. For example, finger gestures made with two side-by-side fingers as shown in FIG. 10 may be used to scroll content on a display whereas finger gestures made with a single finger may be used to move a cursor on a display, if desired.

Figure 11:
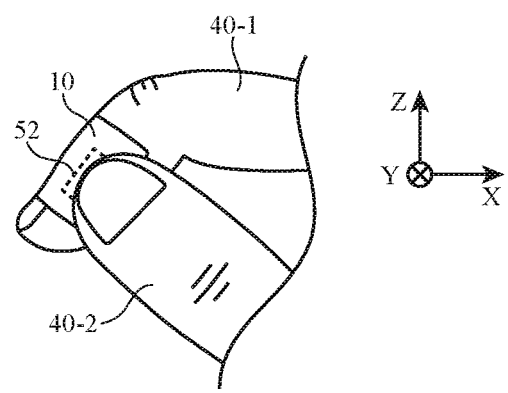
FIG. 11 is a perspective view of an illustrative finger device being used to detect input on the side of the finger device in accordance with an embodiment.

FIG. 11 shows an example in which finger device 10 is being used to detect finger input on device 10. In particular, device 10 may be worn on finger 40-1 (e.g., a pointer finger or other suitable finger) and may detect activities of finger 40-2 (e.g., a thumb or other suitable finger) as it makes contact with and/or as it comes in proximity to device 10. For example, proximity sensor 52 may measure a change in distance between sensor 52 and finger 40-1 as finger 40-2 contacts the exterior surface of device 10. In this way, sensors 52 can detect swipes, pinches, taps, presses, press-and-holds, or other gestures on device 10.

Figure 12:
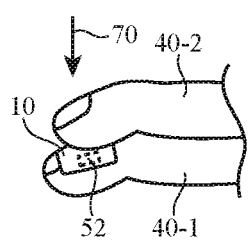
FIG. 12 is a perspective view of an illustrative finger device being used to detect input on an upper portion of the finger device in accordance with an embodiment.

FIG. 12 shows an example in which finger device 10 is being used to detect finger input on top of device 10. In particular, device 10 may be worn on finger 40-1 (e.g., a pointer finger or other suitable finger) and may detect activities of finger 40-2 (e.g., a middle finger or other suitable finger) as it makes contact with the upper surface of device 10. For example, proximity sensor 52 may measure a change in distance between sensor 52 and finger 40-1 as finger 40-2 contacts the upper surface of device 10. Sensor 52 may measure changes in the position of the top of finger 40-1 relative to sensor 52 (e.g., changes in the position of the fingernail relative to sensor 52) and/or may measure changes in position of one or more sides of finger 40-1 relative to sensor 52 as finger 40-2 contacts the top of finger 40-1 (and/or the top of device 10). In this way, sensors 52 can detect finger gestures on the upper surface of device 10.

Figure 13:
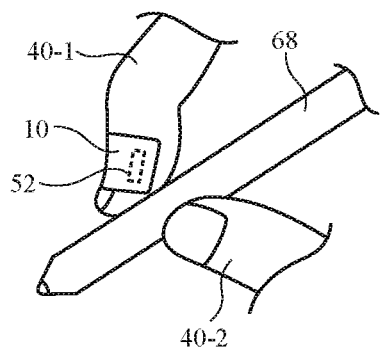
FIG. 13 is a perspective view of an illustrative finger device being used to detect input as the user holds an object in accordance with an embodiment.

FIG. 13 is an example showing how device 10 may be used to turn an object into an input device. In the example of FIG. 13, object 68 may be a pen or pencil that does not contain any circuitry. A user wearing one or more finger devices 10 may rotate object 68 about its longitudinal axis, may move the tip of object 68 across a surface (e.g., surface 48 of structure 50 of FIG. 3), and/or may tap or press the tip of object 68 on a surface, and/or may make other movements of object 68. During movement of object 68, proximity sensors 52 in device 10 may detect small changes in distance between finger 40 and sensors 52, which in turn can be used to determine the location, orientation, and movement of object 68.

Figure 14:
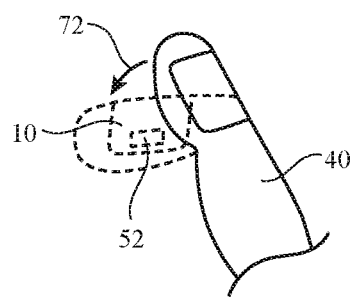
FIG. 14 is a perspective view of an illustrative finger device being used to detect a finger curling movement in accordance with an embodiment.

FIG. 14 shows an example in which finger device 10 is being used to detect a curling motion of finger 40. In particular, device 10 may be worn on finger 40 (e.g., a pointer finger or other suitable finger) and may detect movement of the tip of finger 40 relative to the base of finger 40. As the tip of finger 40 curls in direction 72, the sides of finger 40 may be pushed outward, resulting in small changes in distance between proximity sensors 52 and finger 40. By measuring these small changes in distance with sensor(s) 52, device 10 can measure the position of the tip of finger 40 as it moves relative to the base of finger 40.

If desired, the finger gestures of FIGS. 5-14 may be combined with one another and/or combined with other finger gestures to provide different types of user input to an electronic device. As an example, a user may select an item on a display in device 24 by tapping finger 40 on a surface (as shown in the example of FIG. 6) and, once the item has been selected, the user may manipulate the selected item by moving finger pulp 40P with a thumb like one would move a joystick (e.g., as shown in FIG. 5). Multi-finger gestures may be detected by detecting an adjacent finger as the user pinches against the finger pulp of a finger wearing device 10, by detecting an adjacent finger as the user presses a finger wearing device 10 against a surface, by detecting an adjacent finger as the user touches the outside of device 10, etc.

Figure 15:
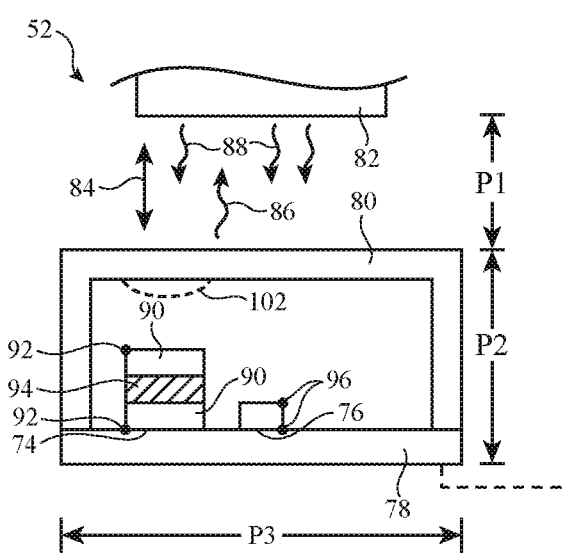
FIG. 15 is a cross-sectional side view of an illustrative self-mixing proximity sensor in accordance with an embodiment.

FIG. 15 is a diagram of an illustrative self-mixing proximity sensor (sometimes referred to as a self-mixing sensor or proximity sensor) and an associated target. As shown in FIG. 15, self-mixing proximity sensor 52 may include a laser such as vertical cavity surface emitting laser 74 (e.g., self-mixing proximity sensor 52 may be a coherent self-mixing sensor having a diode laser or other coherent or partially coherent source of light or other electromagnetic radiation). Laser 74 may have thin-film interference filter mirrors 90 (sometimes referred to as Bragg reflectors) each of which is formed from a stack of thin-film layers of alternating index of refraction. Active region 94 may be formed between mirrors 90. The lower mirror in laser 74 may have a nominal reflectivity of 100% or, in configurations such as bottom-emitting configurations, may have a nominal reflectivity of less than 100%. In some cases, the laser can emit from both the top and bottom. This is particularly useful if the laser is sitting above a photodetector. The upper mirror in laser 74 may have a slightly lower reflectivity, so that laser 74 emits light 86 towards target 82. Laser 74 may be controlled by applying a drive signal to terminals 92 using control circuitry 12 (e.g., a drive circuit in circuitry 12). Sensing circuitry in circuitry 12 can measure the light output of laser 74.

Emitted light 86 may have a wavelength of 850 nm or other suitable wavelength (e.g., a visible wavelength, an ultraviolet wavelength, an infrared wavelength, a near-infrared wavelength, etc.). Target 82 may be, for example, part of the user's finger (e.g., the side portions of the user's finger near the fingernail) and/or may be a flexible membrane in device 10 that rests against the user's finger and that moves in response to movement of the finger. When emitted light 86 illuminates target 82, some of emitted light 86 will be reflected backwards towards proximity sensor 52. Proximity sensor 52 may include a light sensitive element (e.g., a light detector) such as photodiode 76 (e.g., a resonant cavity photodetector or other suitable light detector). Terminals 96 of photodiode 76 may be coupled to sensing circuitry in control circuitry 12. This circuitry gathers photodiode output signals that are produced in response to reception of reflected light 88. In addition to using a photodiode, self-mixing can be detected using laser junction voltage measurements (e.g., if the laser is driven at a constant bias current) or laser bias current (e.g., if the laser is driven at a constant voltage). A protective cover such as protective structure 80 may, if desired, be mounted over laser 74 and photodiode 76. Protective structure 80 may be transparent (or may have transparent portions). If desired, a lens element such as lens element 102 may be incorporated into or attached to structure 80 to help direct light to target 82 and increase the signal-to-noise ratio of proximity sensor 52.

Target 82 is located at a distance P1 from proximity sensor 52. Proximity sensor 52 may have a height P2 and a width P3. Height P2 may be between 0.5 mm and 1 mm, between 1 mm and 2 mm, between 0.1 mm and 0.5 mm, between 1 mm and 5 mm, less than 3 mm, greater than 3 mm, or other suitable height. Width P3 may be between 0.5 mm and 1 mm, between 1 mm and 2 mm, between 0.1 mm and 0.5 mm, between 1 mm and 5 mm, less than 2 mm, greater than 2 mm, or other suitable width.

Some of light 88 that is reflected or backscattered from target 82 reenters the laser cavity of laser 74 and perturbs the electric field coherently, which also reflects as a perturbation to the carrier density in laser 74. These perturbations in laser 74 causes coherent self-mixing fluctuations in the power of emitted light 86 and associated operating characteristics of laser 74 such as laser junction voltage and/or laser bias current. These fluctuations may be monitored. For example, the fluctuations in the power of light 86 may be monitored using photodiode 76. In the example of FIG. 15, photodiode 74 and laser 76 are formed adjacent to each other on the upper surface of substrate 78.

Figure 16:
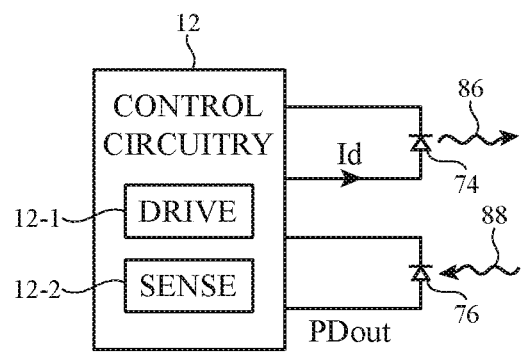
FIG. 16 is a circuit diagram of self-mixing proximity sensor circuitry in accordance with an embodiment.

As shown in FIG. 16, control circuitry 12 includes circuitry for implementing a driver for laser 74 (drive circuit 12-1) and circuitry for implementing a sensing circuit for photodiode 76 (sense circuit 12-2). Drive circuit 12-1 is used in applying a modulated drive current Id to laser 74. Sense circuit 12-2 is used in gathering signals PDout from photodiode 76 that are processed by control circuitry 12 or output signals may be gathered using junction voltage or bias current measurements.

A modulation scheme is used for driving laser 74 for the purpose of inducing a wavelength modulation, and a photodiode signal processing scheme or junction voltage or bias current processing scheme is used in processing the measured self-mixing fluctuations in output power to that allow control circuitry 12 to determine the distance P1 between proximity sensor 52 and target 82 in accordance with the principles of self-mixing interferometry.

A modulation scheme for driving laser 74 may, for example, use a sinusoidal wave drive signal, a triangular wave drive signal, and/or other suitable drive signal that, due to the dependence of output wavelength on drive current magnitude of laser 74, continuously varies the wavelength of light 86. The wavelength variations of light 86 cause the self-mixing interference signal of laser 74 to exhibit ripples. The processing scheme used on the photodiode signal can extract information from these ripples, from which distance P1 may be calculated. Distance P1 may, for example, be determined within less than 1 micron accuracy, less than 0.2 mm accuracy, less than 0.15 mm accuracy, less than 0.1 mm accuracy, less than 0.01 mm accuracy, or other suitable accuracy. Due to this high accuracy, measurements of extremely small changes in the position of finger 40 can be made with a high confidence.

Figure 17:
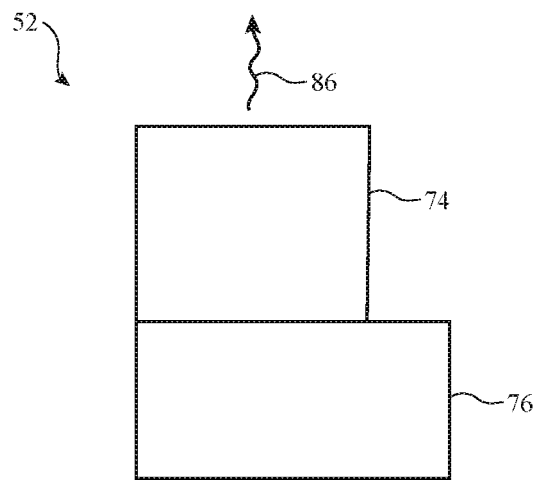
FIGS. 17, 18, and 19 are side views of illustrative laser and photodiode configurations for a self-mixing proximity sensor in accordance with embodiments.

The example of FIG. 15 in which laser 74 and photodiode 76 are formed side-by-side on substrate 78 is merely illustrative. Other arrangements may be used, if desired. For example, photodiode 76 may be formed or bonded under laser 74, may be monolithically integrated into laser 74, or may be formed or bonded on top of laser 74. In the example of FIG. 17, photodiode 76 is an integrated monolithic photodiode that is formed under laser 74. If desired, photodiode 76 may be an intra-cavity photodiode that is located in the cavity of laser 74 (e.g., between reflectors 92 of FIG. 15).

Figure 18:
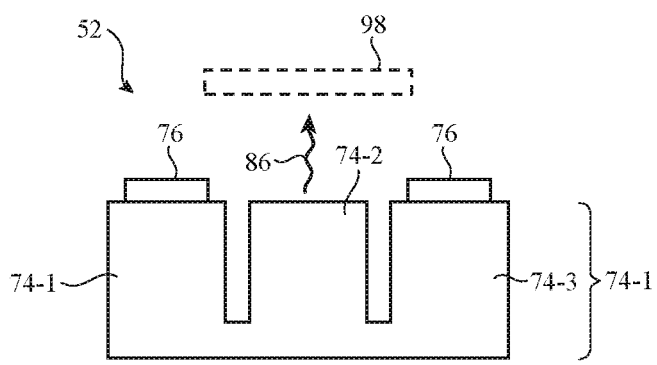

In the example of FIG. 18, photodiode 76 is an integrated monolithic photodiode having a ring-shape that surrounds laser 74. Laser 74 may have a corresponding ring-shaped portion 74-1 that surrounds an inner portion 74-2. If desired, inner portion 74-2 may be forward biased and outer ring-shaped portion 74-1 may be reverse biased. Inner portion 74-2 may emit light 86. If desired, a beam splitter such as beam splitter 98 may be placed between portion 74-2 of laser 74 and target 82.

Figure 19:
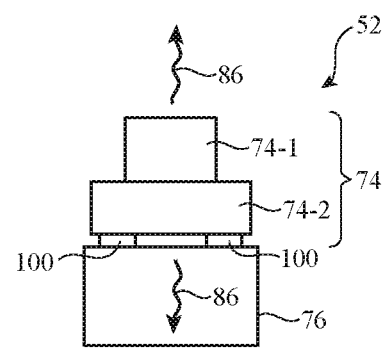

In the example of FIG. 19, laser 74 has been coupled to a separate photodiode 76 using coupling structures 100 (e.g., solder bumps, epoxy, adhesive, etc.). If desired, laser 74 may emit light 86 from the top and bottom of laser 74. The top-emitted light 86 may be directed to target 82 and the bottom emitted light may be absorbed by photodiode 76.

Figure 20:
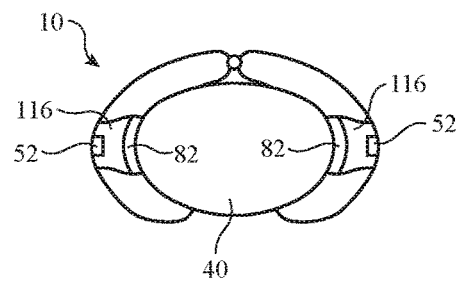
FIG. 20 is a cross-sectional side view of an illustrative finger device with proximity sensors that measure distances to flexible membranes that rest against side portions of a finger in accordance with an embodiment.

FIG. 20 is a cross-sectional side view of an illustrative finger device with proximity sensors 52. As shown in FIG. 20, optical proximity sensors may be separated from target 82 by cavity 116. Cavity 116 may be filled with air, fluid, and/or other suitable material through which optical signals associated with proximity sensor 52 may pass as light passes from sensor 52 to target 82 and from target 82 to sensor 52. In the example of FIG. 20, target 82 is a flexible membrane (e.g., a flexible layer of silicone, polymer, or other material) that rests against the sides of finger 40. As finger 40 moves, the distance between membrane 82 and sensor 52 (e.g., distance P1 of FIG. 15) may change. These changes in distance between membrane 82 and sensor 52 may be measured to thereby detect movements of different portions of finger 40 (e.g., micromovements associated with the finger gestures described in connection with FIGS. 3-14).

The use of optical proximity sensors for sensors 52 is merely illustrative. Proximity sensors in device 10 such as sensors 52 may be ultrasonic sensors (e.g., having a ultrasonic transducer and a corresponding detector), magnetic sensors, capacitive sensors, pressure sensors, and/or other sensors configured to gather information on the location and movement of finger 40.

If desired, proximity sensor 52 may include a pressure sensor (e.g., in addition to or instead of an optical distance sensor) in cavity 116 that measures barometric pressure changes as membrane 82 moves in response to finger movement. Arrangements in which membrane 82 incorporates one or more force sensors may also be used. For example, membrane 82 may include a strain gauge for measuring force and/or may include a capacitive electrode that is used to measure force (e.g., by detecting a change in distance between the electrode on membrane 82 and an electrode in sensor 52).

Figure 21:
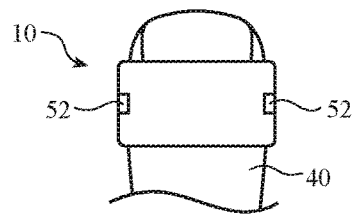
FIGS. 21, 22, 23, 24, and 25 are top views of illustrative finger devices with different numbers and locations of proximity sensors in accordance with embodiments.

FIGS. 21, 22, 23, 24, and 25 show illustrative locations and numbers of proximity sensors 52 in device 10. In the example of FIG. 21, a single proximity sensor 52 is located on the left side of finger 40, and a single proximity sensor 52 is located on the right side of finger 40. If desired, the sensors may not be directly opposite one another (e.g., one sensor 52 may be closer to the tip of finger 40 than the other sensor 52 so that data from the two sensors 52 can be compared to detect front-to-back movements as well as side-to-side movements).

Figure 22:
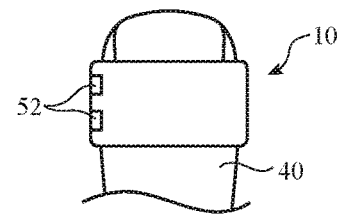

In the example of FIG. 22, two sensors 52 are located only on one side of device 10. The data from the two sensors 52 may be compared to detect front-to-back movements as well as side-to-side movements.

Figure 23:
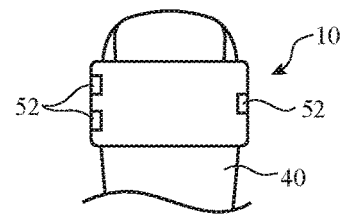

In the example of FIG. 23, two sensors 52 are located on the left side of device 10, and one sensor 52 is located on the right side of device 10. The data from sensors 52 may be compared to detect front-to-back movements as well as side-to-side movements.

Figure 24:
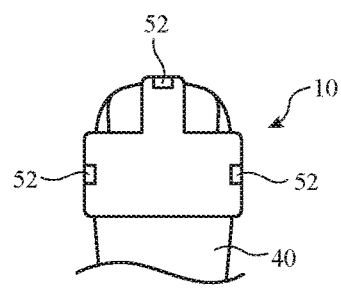
Figure 25:
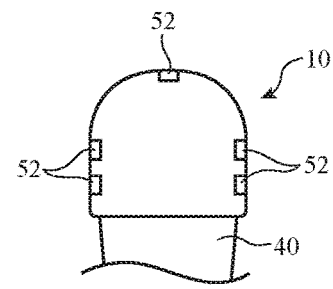

FIGS. 24 and 25 show illustrative examples in which device 10 includes sensors 52 on the sides and the tip of the user's finger. In the example of FIG. 24, device 10 does not cover the user's fingernail. In the FIG. 25 example, the fingernail is covered by device 10. The examples of FIGS. 21-25 are merely illustrative. There may be one, two, three, four, five, six, ten, more than ten, or less than ten sensors 52 in device 10 mounted in any suitable location of device 10.

Figure 26:
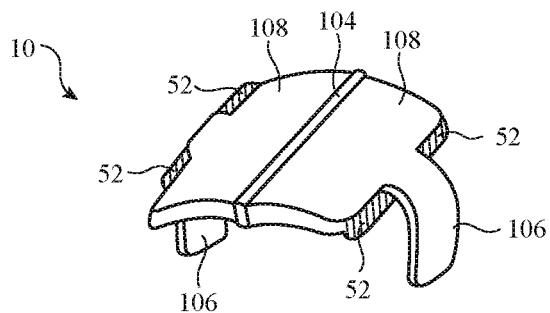
FIG. 26 is a perspective view of an illustrative finger device having proximity sensors on opposing sides of a sidewall structure in accordance with an embodiment.
Figure 27:
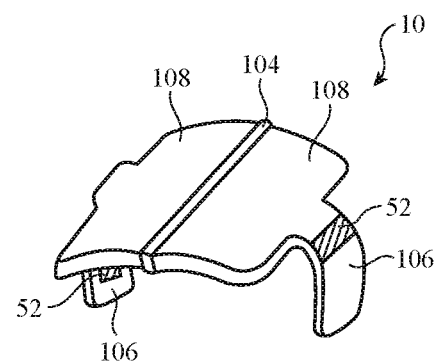
FIG. 27 is a perspective view of an illustrative finger device having proximity sensors located on sidewall structures in accordance with an embodiment.

FIGS. 26, 27, 28, 29, 30, and 31 are diagrams of device 10 showing illustrative locations of sensors 52. As shown in FIG. 26, device 10 may include first and second housing portions 108 coupled by hinge 104. Hinge 104 may allow housing portions 108 to be moved towards or away from each other to accommodate fingers of different sizes. Each housing portion 108 may have a sidewall portion such as sidewall portion 106 that extends down a side portion of the user's finger. In the example of FIG. 26, proximity sensors 52 are located on opposing sides of sidewall portion 106. FIG. 27 shows an example in which proximity sensors 52 are located on sidewall portion 106 itself.

Figure 28:
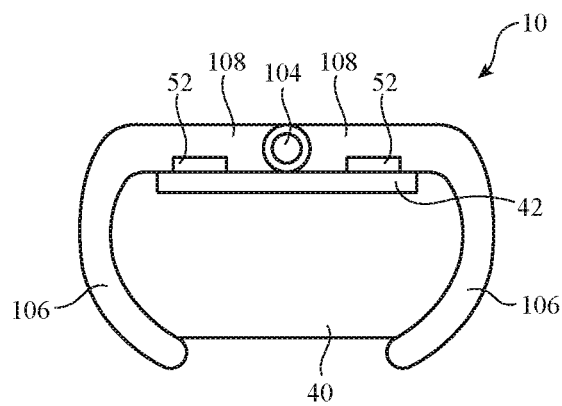
FIG. 28 is a cross-sectional side view of an illustrative finger device having proximity sensors on a upper portion of the finger device in accordance with an embodiment.

FIG. 28 shows an example in which sensors 52 are located in an upper portion of device 10 (e.g., in housing portions 108) so that sensors 52 rest on the user's fingernail 42.

Figure 29:
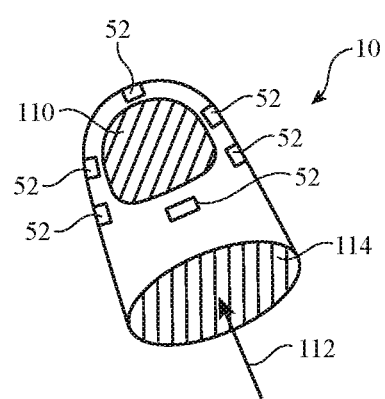
FIG. 29 is a perspective view of an illustrative finger device having housing that covers most of the tip of the user's finger and having proximity sensors in accordance with an embodiment.

In the example of FIG. 29, device 10 has a thimble shape with an opening 114 for receiving the user's finger. The user may insert his or her finger in opening 114 in direction 112. Device 10 may have an additional opening such as opening 110 that exposes the finger pad of the finger. Since device 10 has a finger glove shape that covers most of the tip of the user's finger, sensors 52 may be located below the user's finger (adjacent to the finger pad which is exposed through opening 110), on the sides of the user's finger, on top of the user's finger, at the tip of the user's finger, and/or in any other suitable location of device 10.

Figure 30:
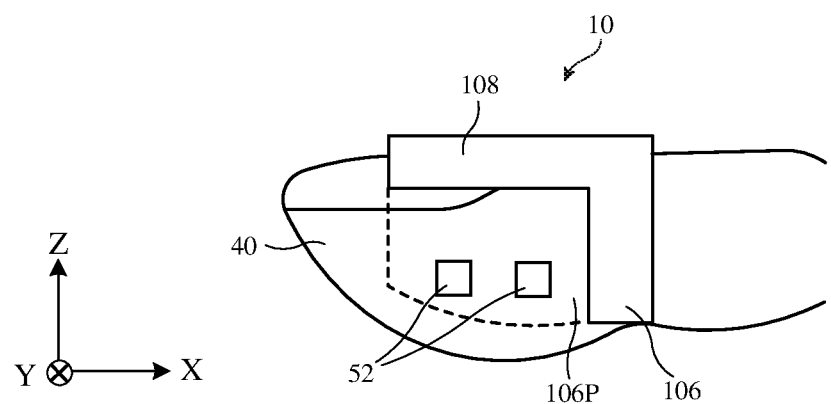
FIG. 30 is a side view of an illustrative finger device having a side housing portion that extends down a back end of a fingertip and having proximity sensors in accordance with an embodiment.

FIG. 30 shows an example in which sidewall portion 106 extends down a back end of the tip of finger 40 (e.g., closer to the joint between the distal phalanx and the middle phalanx). This provides additional real estate along the side portions of the fingertip for sensors 52. In particular, sensors 52 may be mounted in side housing portion 106P. Side housing portion 106P may be formed from the same or different material as side housing portion 106. If desired, side housing portion 106P may be formed from a softer and/or more flexible material than side housing portion 106. For example, side housing portion 106 may be rigid to provide the desired clamping force to hold device 10 on finger 40, while side housing portion 106P may be flexible so that finger movements will cause corresponding deformations in housing 106P (e.g., in membrane 82 in housing 106P) that can be detected by sensors 52.

Figure 31:
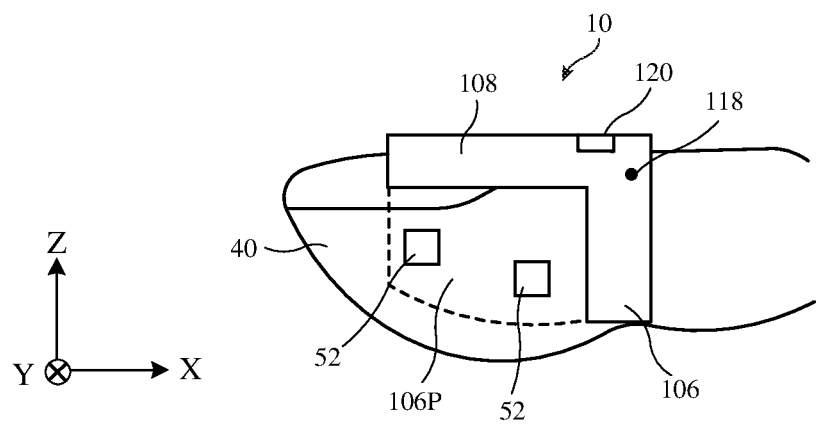
FIG. 31 is a side view of an illustrative finger device having a side housing portion that extends down a back end of a fingertip and having proximity sensors at different heights along the side of the finger accordance with an embodiment.

Sensors 52 may be located at the same height of the side portion of the user's finger 40, as shown in FIG. 30. In another suitable arrangement, sensors 52 may be located at different heights along the side portion of the user's finger 40. This type of arrangement is illustrated in FIG. 31. As shown in FIG. 31, sensors 52 may be offset with respect to one another (e.g., offset from one another such that one sensor 52 is closer to top housing portion 108 than the other sensor 52). For example, sensor 52 that is closer to the tip of finger 40 may be higher and closer to top housing portion 108 than the other sensor 52 that is closer to the back end of the fingertip. This type of arrangement may help ensure that front sensors 52 do not inadvertently strike the surface that finger 40 is contacting while wearing device 10. If desired, control circuitry 14 may process sensor data to compensate for any decreased sensitivity in sensors 52 that results from being higher up on the side of the finger.

It may be desirable to incorporate biasing structures in device 10 to keep device 10 appropriately positioned on finger 40. For example, when side housing portion 106 is closer to the back end of the fingertip, as in the examples of FIGS. 30 and 31, biasing structure 120 may be used to bias top housing portion 108 towards finger 40. Biasing structure 120 (e.g., a spring) may help minimize rotation of housing 108 away from finger 40 about pivot point 118.

Figure 32:
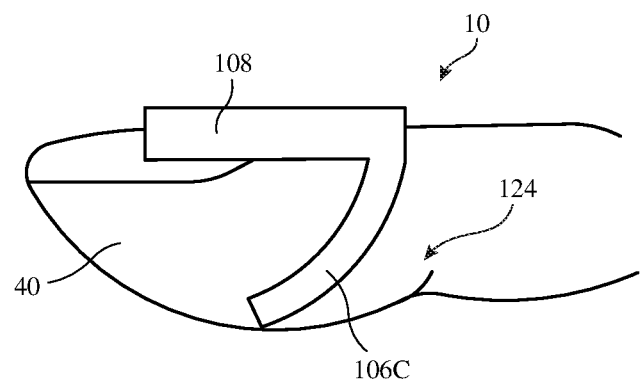
FIG. 32 is a side view of an illustrative finger device having a side housing portion that curves away from a back end of a fingertip in accordance with an embodiment.

FIG. 32 is a side view of device 10 showing how side housing portion 106 may have a curved portion such as curved portion 106C. Curved portion 106C may be curved away from the middle phalanx to minimize bulging of finger 40 at location 124, which might otherwise cause device 10 to become misplaced on finger 40.

Figure 33:
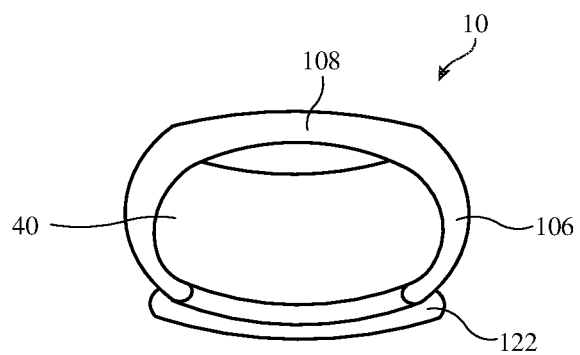
FIG. 33 is a cross-sectional side view of an illustrative finger device having a strap in accordance with an embodiment.

FIG. 33 is a cross-sectional side view of device 10 showing how a strap may be used to help secure device 10 to finger 40. Strap 40 may have a first end coupled to a first of side portions 106 and a second end coupled to a second of side portions 106. Strap 40 may be elastic (e.g., may be formed from an elastomeric polymer), may be formed from fabric, and/or may be formed from other materials. Strap 40 may be permanently attached to side housing portions 106 or may be removable (e.g., may be coupled to portions 106 with an attachment structure such as a buckle, snap, tie, magnets, etc.). Strap 40 may extend around a bottom portion of finger 40 closer to the middle phalanx of finger 40 so that the finger pad of finger 40 can contact external surfaces without interference by strap 40.

As described above, one aspect of the present technology is the gathering and use of information such as sensor information. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, eyeglasses prescription, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. A finger device configured to be worn on a finger of a user, comprising:
    a housing configured to be mounted on the finger;
    a flexible membrane coupled to the housing that rests against a side portion of the finger and that moves in response to movement of the finger; and
    a self-mixing optical sensor that measures changes in a distance between the self-mixing optical sensor and the flexible membrane.

2. The finger device defined in claim 1 wherein the self-mixing optical sensor comprises a laser and an integrated photodiode.

3. The finger device defined in claim 2 further comprising control circuitry that sends control signals to an electronic device based on the changes in the distance.

4. The finger device defined in claim 3 wherein the control circuitry modulates a drive current applied to the laser.

5. The finger device defined in claim 1 wherein the self-mixing optical sensor has submicron resolution.

6. A finger device configured to be worn on a finger of a user, comprising:
    a housing configured to be coupled to the finger without covering a lower finger pad surface of the finger;
    a flexible membrane configured to rest against a side of the finger;
    a proximity sensor coupled to the housing and separated from the flexible membrane by a cavity, wherein the proximity sensor measures changes in a distance separating the proximity sensor from the flexible membrane; and
    control circuitry configured to gather input from the proximity sensor as the finger moves.

7. The finger device defined in claim 6 wherein the proximity sensor comprises a capacitive proximity sensor.

8. The finger device defined in claim 6 wherein the proximity sensor comprises a self-mixing interferometric optical proximity sensor.

9. The finger device defined in claim 8 wherein the self-mixing interferometric optical proximity sensor comprises a vertical cavity surface emitting laser.

10. The finger device defined in claim 9 wherein the self-mixing interferometric optical proximity sensor comprises a photodiode and wherein the control circuitry includes a drive circuit configured to modulate the vertical cavity surface emitting laser and includes a sense circuit configured to use the photodiode to measure corresponding self-mixing fluctuations in output light intensity from the vertical cavity surface emitting laser.

11. The finger device defined in claim 10 wherein the vertical cavity surface emitting laser comprises a laser cavity and wherein the photodiode is integrated in the laser cavity.

12. The finger device defined in claim 10 wherein the photodiode forms a ring around the vertical cavity surface emitting laser.

13. The finger device defined in claim 10 wherein the vertical cavity surface emitting laser is stacked on top of the photodiode.

14. The finger device defined in claim 6 wherein the proximity sensor is one of multiple proximity sensors that measure movement of the finger as the lower finger pad surface is moved by a thumb finger.

15. The finger device defined in claim 6 wherein the proximity sensor is one of multiple proximity sensors that measure movement of the finger as the lower finger pad surface is moved by a surface.

16. A finger device configured to be worn on a finger of a user, comprising:
- a housing having sidewall portions that extend down first and second sides of the finger and that leave the finger pad exposed;
- a flexible membrane that rests against the first side of the finger and that moves in response to movement of the finger pad;
- a distance sensor separated from the flexible membrane by a cavity, wherein the distance sensor measures a distance separating the distance sensor from the flexible membrane; and
- control circuitry that sends control signals to an electronic device based on the distance.

17. The finger device defined in claim 16 wherein the distance sensor comprises a self-mixing optical distance sensor.

18. The finger device defined in claim 17 wherein the self-mixing optical distance sensor comprises a vertical cavity surface emitting laser.

19. The finger device defined in claim 18 wherein the self-mixing optical distance sensor comprises a resonant cavity photodiode.

20. The finger device defined in claim 16 further comprising:
- an additional flexible membrane that rests against the second side of the finger and that moves in response to movement of the finger pad; and
- an additional distance sensor that measures an additional distance to the additional flexible membrane, wherein the control circuitry uses the distance and the additional distance to detect front-to-back and side-to-side movements of the finger pad.

* * * * *